June 24, 1969 D. C. KUHNS ET AL 3,451,122

METHODS OF MAKING SOLDERED CONNECTIONS

Filed June 11, 1964

INVENTORS
Donald C. Kuhns
David W. Potts

BY R. P. Miller

ATTORNEY 3,451,122
METHODS OF MAKING SOLDERED CONNECTIONS

Donald C. Kuhns, Wescosville, and David W. Ports, Allentown, Pa., assignors to Western Electric Company, Incorporated, New York, N.Y., a corporation of New York Filed June 11, 1964, Ser. No. 374,317
Int. Cl. B23k *1/00;* H01r *43/00*
U.S. Cl. 29—475 7 Claims This invention relates to methods of making soldered connections and more particularly to methods for securing terminal leads to heat sensitive films formed on substrates.

In the fabrication of electrical and electronic circuit modules, miniature electronic and solid state components are mounted on or electrically connected to thin film circuit patterns formed on a dielectric substrate. In one construction, the circuit pattern is formed by sputtering tantalum on a ceramic base. In other instances, the circuit pattern is in the form of a thin copper foil adhered or attached to a plastic base. In effecting connections to the circuit patterns, considerable care must be exercised to avoid damage to (1) the circuit path, or (2) the base. It has been found that conventional soldering techniques concentrate heat in the vicinity of the connection so that damage to the circuit path or base often results. In effecting a soldered connection to a thin film circuit path, it is necessary that a connection be obtained that is sufficiently strong to withstand mechanical forces that the circuit module is subjected to during normal use. The solder connection must be able to withstand axial forces imparted to the lead as well as transverse or bending forces without destruction of the soldered connection.

An object of the invention resides in new and improved methods of making soldered connections.

Another object of the invention resides in a method of making strong connections between small wires or terminal leads and thin film of coil circuit patterns without damaging the film or foil.

A further object of the invention is the provision of a method for attaching a lead or terminal to a thin film wherein the lead or terminal is first bent and abutted against the film whereafter solder or other bonding material is flowed along the bent section to effectuate the soldered connection.

An additional object of the invention resides in a method of upsetting or enlarging an end of a right angle bend section of a lead wire or terminal and then flowing solder along the bent section to form a solder fillet around the upset end of the wire or terminal.

With these and other objects in view, the present invention contemplates a method of connecting a right angle bend section of a terminal lead or wire to a heat sensitive surface. More particularly, the invention contemplates bending a terminal wire to form a right angle section, abutting the end surface of the right angle section against a thin metallic film, and then flowing solder or other heated adhesive materials along the bent section to form a fillet about the end of the abutting wire to attach the wire to the thin film. In order to further increase the strength of the bond, the end of the wire may be upset so that the fillet is formed about the upset end to firmly secure the wire to the thin film. A machine that is capable of practicing the method of this invention is disclosed in the copending application to R. D. Kauffman, Ser. No. 374,330, filed June 11, 1964, now U.S. Patent Number 3,283,987 issued Nov. 8, 1966.

Other objects and advantages of the invention will be apparent from the following detailed description when considered in conjunction with the accompanying drawings; wherein.

Referring first to FIGS. 1–4, it is desired to attach a terminal lead 10 to a thin metallic film 11 formed on a ceramic substrate 12. The lead 10 may be a narrow, flat ribbon as shown, or it may be a wire of circular or other configuration. The lead may be constructed of a copper-nickel alloy or other materials or alloys to which a solder will adhere.

The film 11 may be formed by sputtering tantalum onto a ceramic or glass substrate 12 and then applying a solderable coating such as palladium. In other applications of the method, the film may be in the form of a thin copper foil which is attached or adhered to a substrate or base constructed of plastic or other material. The substrate in this instance may be heat sensitive, thin, and flexible.

Figure 1:
FIG. 1 shows a perspective view of a section of lead stock that is to be connected to a thin film in accordance with the method of the present invention.
Figure 2:
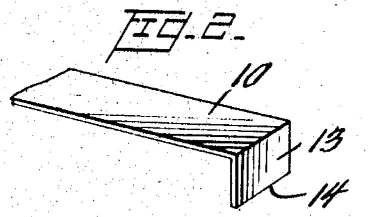
FIG. 2 is a perspective view of the section of lead stock bent to form a right angle portion in accordance with one step of the present invention.
Figure 3:
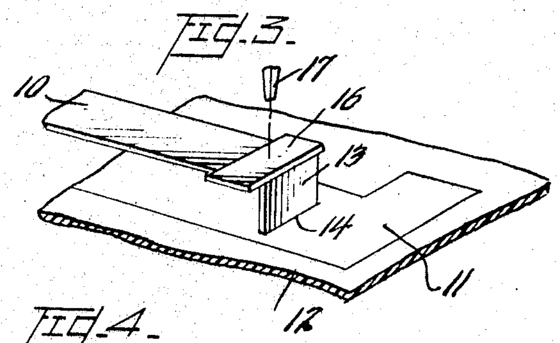
FIG. 3 illustrates in perspective the abutting of the lead stock with a thin film together with the placing of solder in anticipation of effectuating a soldered connecnection.
Figure 4:
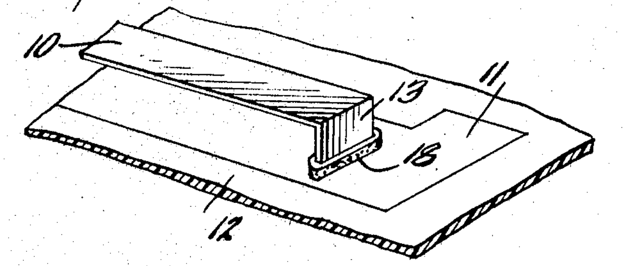
FIG. 4 is a perspective view of a lead soldered to a thin film in accordance with the practice of the method of the present invention.

In practice of the method, the lead 10 is bent to form a right angle section 13 (see FIG. 2) having a terminal face 14 which is abutted against the film 11 as shown in FIG. 3. An end of a solder wire 16 or a solder preform is placed on the lead 10 in the vicinity of the right angle bend. A heat source 17 which may be a soldering iron is placed in engagement with the top surface of the solder 16 so that the solder melts and flows over the top surface of the stock material and along all four sides of the right angle bend section 13. The stock is selected to be sufficiently narrow so that the solder flows over the edges of the strip in the vicinity of the bend and is distributed along all four sides of the bent section by the time the solder reaches the juncture with the film. Inasmuch as the solder has an affinity to the lead stock material 10, it will flow all around the four sides of the bent section to form a fillet 18 that completely surrounds the bent section 13 at the juncture with the film 11. The end of the bent section of the stock material is completely encased in the fillet 18. The fillet thus engages the maximum area of both the bent section 13 and the film 11. The solder connection provides a joint of maximum strength against both axial and transverse forces imparted to the lead 10.

Figure 5:
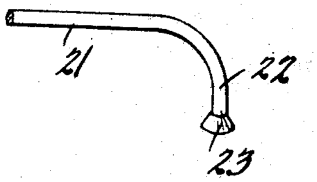
FIG. 5 illustrates an alternative embodiment of the method wherein the lead has an arcuate bend imparted thereto and the bent section is upset.
Figure 6:
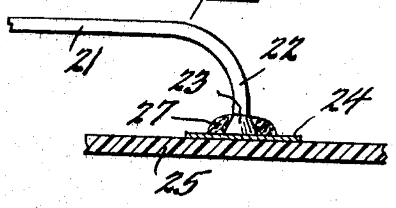
FIG. 6 is a cross section of the lead fabricated in accordance with the alternative embodiment of the invention and then soldered to a thin film or foil secured to a substrate.

In the alternative embodiment of the invention shown in FIGS. 5 and 6, a circular cross section wire 21 is shown with an arcuate bend section 22. Following the bending of the wire 21 or prior thereto, the end is upset to provide a bulge or flared extremity 23. The flared extremity 23 is abutted against a thin film 24 formed on a substrate 25. Solder 26 is brought into engagement with the arcuate bend section 22, but at a point removed from the flared extremity 23. The solder is again heated and allowed to flow along the arcuate bend section 22. The solder will completely flow around the wire and form a fillet 27 which completely encompasses the flared extremity 23. The fillet when cooled, securely locks the wire 21 within the fillet 27 which is bonded or soldered to the film 24.

The method also finds utility in effecting the connection of any type of elongated member to a heat sensitive surface. In such instances, it may be desired to use a nonmetallic bonding material such as adhesive that is placed in a molten condition by the application of heat. The molten adhesive will flow along the bent section of the elongated member to form a bonding fillet about the juncture of the bent end of the member with the heat sensitive surface.

In the practice of both embodiments of the invention, it may be appreciated that the heat source is never brought into engagement with the film or foil and; hence, the possibility of damage thereto is alleviated. By abutting the bent end of the lead to the foil or abutting the foil against the bent end of the lead, a minimum amount of surface area contact exists between the lead and the film. This allows for the solder fillet to engage maximum areas of both the lead and the film to provide a joint of maximum strength.

The above-described method steps and selection of components are merely illustrative of certain aspects of the invention and many other changes may be made without departing from the invention.

What is claimed is:

1. A method of securing an elongated member to a heat sensitive surface which comprises, bending a section of the elongated member, abutting an end of the bent section of said member against the heat sensitive surface, placing bonding material on said elongated member and spaced from said surface, and then heating the bonding material to flow the bonding material along the bent section and then into engagement with the heat sensitive surface to form a fillet about the junction of the abutting end of the member and the heat sensitive surface, whereby the bonding material is heated at a point on said elongated member remote from said surface to prevent damage to the heat sensitive surface.

2. A method of attaching a lead to a heat sensitive circuit pattern formed on a substrate which comprises, bending a section of lead stock, abutting an end of the section against the circuit pattern, placing solder on top of the lead stock in the vicinity of the bent section at a point remote from said circuit pattern, and then heating and melting the solder to flow said melted solder along the bent section and onto the circuit pattern, whereby the application of heat to said solder to melt said solder is displaced from said heat sensitive pattern to prevent damage thereto.

3. A method of securing a terminal lead to a heat sensitive thin metallic film formed on a ceramic substrate which comprises, arcuately bending an end section of the terminal lead to move the end section into a plane which is transverse to the axis of the lead, abutting an end surface of the bent end section of the lead against the heat sensitive thin metallic film, placing solder on said lead in the vicinity of where the end section is bent away from the axis of the lead, and then heating the solder to flow molten solder from the start of the bend and along the length of the arcuately bent section into engagement with the heat sensitive thin metallic film to form a fillet of solder about the juncture of the end section and the heat sensitive thin metallic film, whereby the flowing of said solder is initiated away from said thin film to prevent damage thereto.

4. A method of securing a lead to a metal surface which comprises, upsetting an end of a portion of the lead to provide a bulge of lead material at the end thereof, bending the bulged end portion of the lead away from the axis of the lead, abutting the tip of the bulged end against the surface, placing bonding material in engagement with the lead in the vicinity of where the bulged end portion is bent away from the axis of the lead, and heating the bonding material to flow liquid bonding material along the lead to and then about the bulged end into contact with the surface to form a fillet about said bulged end, whereby the bonding material is heated away from said metal surface to prevent damage thereto.

5. A method of soldering a terminal lead ribbon to a solderable coating on a sputtered thin tantalum film formed on a ceramic base which comprises, upsetting an end of an end section of the ribbon to form a bulge, bending the end section of the ribbon to move the end section into a plane that is transverse to the axis of the ribbon, placing a solder preform against the ribbon in the vicinity of the start of the bent end section, and then heating the solder preform to flow the solder over the edges of the ribbon and along the bent section to form a fillet of solder about the bulge whereby the thin tantalum film on the ceramic base is not damaged by the heating of the solder preform.

6. A method of soldering a metal ribbon to a thin metallic heat sensitive foil that is secured to a ceramic substrate which comprises, bending an end section of a length of metal ribbon to form a right angle bend section of a length sufficient to enable solder to flow therealong without solidifying, abutting the end of the right angle bend section to the metallic foil, placing a section of solder on the ribbon and along the line of the bend, and then heating the solder to a molten state to flow over the edges of the ribbon and down the right angle bend section to form a solder fillet about the juncture of the end of the right angle bend section with the metal foil.

7. A method of soldering a terminal lead in the form of a thin, narrow electrically conductive metal ribbon to a palladium coating on tantalum film which is sputtered on a ceramic substrate which comprises, bending an end section of the terminal ribbon to provide a right angle bend section of a predetermined length, abutting the coated tantalum film against the end surface of said right angle bend section, placing a section of solder on the upper surface of the terminal lead in the vicinity of the origin of the right angle bend section, heating the solder to a sufficient degree to flow the solder over the side edges and the bend end of the terminal lead and then along the four sides of the predetermined length of said right angle bend section into engagement with the coated tantalum film, and then cooling the solder to form a fillet about all four sides of the end of the right angle bend section and the coated tantalum film to secure the terminal lead to the coated tantalum film.

References Cited

UNITED STATES PATENTS

| | | | |
|---|---|---|---|
| 2,964,830 | 12/1960 | Henkels et al. | 29—25.3 |
| 2,982,893 | 5/1961 | Spanos | 29—155.5 X |
| 2,989,578 | 6/1961 | Wagner et al. | 29—155.5 X |
| 2,995,475 | 8/1961 | Sharpless. | |
| 3,136,032 | 6/1964 | Berndsen | 29—498 X |

JOHN F. CAMPBELL, *Primary Examiner.*

J. L. CLINE, *Assistant Examiner.*

U.S. Cl. X.R.

29—500, 628